United States Patent [19]

Langer et al.

[11] Patent Number: 5,460,758
[45] Date of Patent: Oct. 24, 1995

[54] METHOD AND APPARATUS FOR PRODUCTION OF A THREE-DIMENSIONAL OBJECT

[75] Inventors: Hans Langer, Gräfelfing, Germany; Miguel Cabrera, Lyons, France

[73] Assignee: EOS GmbH Electro Optical Systems, Planegg, Germany

[21] Appl. No.: 402,739

[22] Filed: Mar. 13, 1995

Related U.S. Application Data

[63] Continuation of Ser. No. 64,158, May 20, 1993, abandoned.

[30] Foreign Application Priority Data

Dec. 21, 1990 [DE] Germany ............................ 40 41 285.7
Apr. 18, 1991 [DE] Germany ............................ 41 12 695.5

[51] Int. Cl.⁶ ........................... B29C 35/08; B29C 41/02
[52] U.S. Cl. ......................... 264/401; 118/429; 118/620; 118/712; 156/64; 156/272.8; 156/273.3; 156/275.5; 156/307.1; 156/378; 156/379.6; 250/432 R; 250/492.1; 264/308; 264/408; 264/497; 356/374; 356/376; 356/4.05; 364/476; 425/135; 425/174.4; 427/8; 427/508; 427/510; 427/512; 427/553; 427/554; 427/555
[58] Field of Search .......................... 264/22, 40.1, 40.2, 264/236, 308; 425/135, 174.4; 156/64, 272.8, 273.3, 273.5, 275.5, 307.1, 378, 379.6; 427/8, 508, 510, 512, 553, 554, 555; 118/429, 620, 712; 250/432 R, 492.1; 356/4, 4.5, 374, 376; 364/468, 476

[56] References Cited

U.S. PATENT DOCUMENTS

| | | | |
|---|---|---|---|
| 4,132,575 | 1/1979 | Suzuki et al. | 156/58 |
| 4,488,172 | 12/1984 | Hutchin | 358/107 |
| 4,499,492 | 2/1985 | Hutchin | 358/107 |
| 4,575,330 | 3/1986 | Hull | 425/194.4 |
| 4,915,757 | 4/1990 | Rando et al. | 156/64 |

FOREIGN PATENT DOCUMENTS

| | | |
|---|---|---|
| 171069 | 2/1986 | European Pat. Off. . |
| 250121 | 12/1987 | European Pat. Off. . |
| 361847 | 4/1990 | European Pat. Off. . |
| 388129 | 9/1990 | European Pat. Off. . |
| 393672 | 10/1990 | European Pat. Off. . |
| 400578 | 12/1990 | European Pat. Off. . |
| 450762 | 10/1991 | European Pat. Off. . |
| 3328753 | 2/1984 | Germany . |
| 2-307728 | 12/1990 | Japan . |
| 2233928 | 1/1991 | United Kingdom . |
| WO88/06494 | 9/1988 | WIPO . |
| WO90/03255 | 4/1990 | WIPO . |

OTHER PUBLICATIONS

Copy of the letter of opposition against EP 0 563 102 (Dated Mar. 15, 1995).
Patent abstracts of Japan, M–1089, Mar. 6, 1991, vol. 15 No. 93 (Abstract of 2–307,728).
Official action for P41 12695516(Oct. 22, 1991) translation of relevant parts and and minutes for oral hearing for P41 12695–16 held on Jul. 29, 1992.
Stereolithography protypes: "Beyond Shoe and Tell", By Chris J. Borman, The National Conference on Rapid Prototyping, Conference Proceedings, pp. 139–142 (Jun. 1990).
Beyond Prototypes: Using Stereolithography for Production–Quality Parts, By Frost Prioleau, pp. 145–147 (Jun. 1990).
3D Systems' SLA 250 User's Reference Manual, Apr. 1989, p. 13–9.
Solid Object Generation, A. J. Herbert, Aug. 1982; Journal of Applied Photographic Engineering, pp. 185–188.
International Search Report (Mailed Mar. 12, 1992).
An English translation of the annex to the examination report, (Mailed Mar. 12, 1992).

*Primary Examiner*—Leo B. Tentoni
*Attorney, Agent, or Firm*—Donald Brown

[57] ABSTRACT

A three-dimensional object is modelled by solidifying superposed layers in such a manner that on an already solidified layer a following layer of initially liquid or powdery material is solidified by light action or the like in correspondence with the form of the object.

35 Claims, 2 Drawing Sheets

METHOD AND APPARATUS FOR PRODUCTION OF A THREE-DIMENSIONAL OBJECT

This is a continuation of application Ser. No. 08/064,158 filed on May 20, 1993, now abandoned.

BACKGROUND OF THE INVENTION

The invention relates to a method and an apparatus for production of a three-dimensional object.

An example for such a method is known as "stereography" or "stereolithography" and described in the paper of Hideo Kodama, "Automatic method for fabricating a three-dimensional plastic model with photo-hardening polymer", Rev. Sci. Instrum. 52(11), Nov. 1981, pages 1770 to 1773. In such a method the problem is encountered that an accuracy to size of the object is not guaranteed. This is in particular caused by the fact that the individual layers change their volume when solidifying and therefore cause stresses and deformations of the entire layered structure.

It is therefore the object of the invention to improve the accuracy in producing the object.

SUMMARY OF THE INVENTION

According to a preferred embodiment of the invention the surface measurement of the object is performed by means of a Moiré-technology as e.g. described in DE-OS 33 28 753. This measurement technique has the advantage that inaccuracies of the solidified surface of the object can be determined in fast and non-contact manner. A further particular advantage results from the fact that the control of the solidification apparatus, i.e. of the light source or the like, is usually made by a computer which also determines the data for the object to be produced on the basis of a CAD design program and which now can be supplied with the measured surface data for evaluation such that the same computer can perform the correction of the object data on the basis of the measurement result. An additional evaluation apparatus is therefore not required.

DETAILED DESCRIPTION OF THE DRAWINGS

Figure 1:
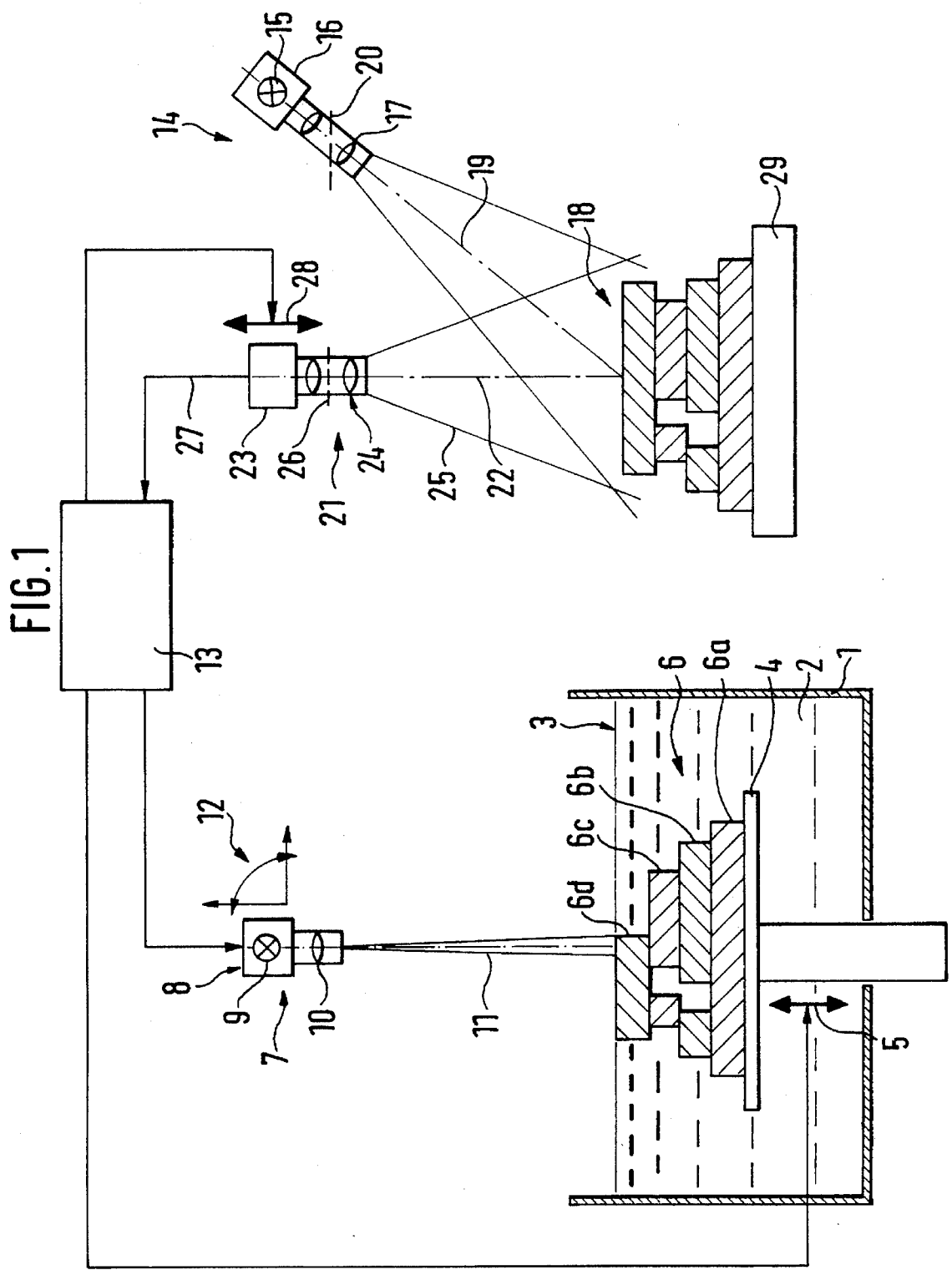
FIG. 1 shows a schematic elevation of a first embodiment of an apparatus for carrying out the inventive method.

FIG. 1 shows a container 1 which is filled with a light curable liquid resin 2 up to a level or surface 3, respectively. A substantially plane support platform 4 is arranged inside the container parallel to the level 3 or the surface of the resin 2, respectively, and can be displaced and positioned up and down in a direction perpendicular to the plane of the level 3 by means of a displacement means 5.

The support platform 4 supports the object 6 which is composed of a plurality of layers 6a, 6b, 6c and 6d each extending parallel to the level 3 in a manner described further below.

A solidifying apparatus 7/for solidifying the uppermost layer 6d adjacent to the surface 3 comprises an illuminating apparatus 8 having a light source 9 directing a focussed beam 11 through an optical system 10 onto the surface of the resin 2. Suitable light sources are an ultra-violet light source, a laser or other light sources, dependent on the type of the resin used. A support or positioning means 12 for the apparatus 7 enables the movement and pivoting motion of the apparatus 7 such that the focussed beam can be positioned at any desired place of the surface 3. This positioning is controlled by a computer 13 connected to the apparatus 7. This connection can additionally be used for adjusting the intensity of the beam 11 by intensity control of the light source 9.

A measuring appliance 14 comprises a projector 16 which is fitted with a light source 15, e.g. an arc lamp or a laser, and which illuminates an area of measurement 18 through an optical system 17. Any other electromagnetic radiation can be used in place of light. Within the course of beam of the projector 16 along the direction of projection 19 there is arranged a modulation apparatus in the form of a projection grating 20, preferably a line grating, or in the form of a laser interferometer for generating a modulation pattern. Owing to the divergence of the beam the line grating or the layer interferometer, respectively, generate a projection of spatially divergent light planes.

The area of measurement 18 is observed by an image recording means 21 along a viewing direction 22 which includes an angle with respect to the direction of projection 19. The image recording means 21 comprises a camera, preferably a video, television or CCD camera, as well as an optical viewing system 24 which can be focussed onto a surface within the area of measurement 18 or the surface of the object 6 which is formed in the manner described further below. A reference grating 26 which is as well formed as a line grating is disposed within the course of the viewing beam 25. The plane of the reference grating 26 is preferably parallel to the plane of the projection grating 20 or to the laser interferometer, respectively.

The image recording means 21 is coupled to the computer 13 through a line 27. Further, a schematically indicated displacement apparatus 28 is provided which is coupled to the computer 13 for moving and positioning the image recording means 21 in direction perpendicular to the observed area of measurement 18.

In operation data defining the shape of the object 6 are generated within the computer by using a design program or the like. These data are treated for the manufacture of the object 6 in such a manner that the object is split up into a large number of horizontal layers which are thin compared to the dimension of the object, and the form data are made available in the form of data sets, e.g. CAD data, for each layer 6a ... 6d of this plurality of layers. This generation and treatment of the data for each layer can be carried out before or simultaneously with the manufacture of each layer.

The computer 13 then controls the displacement means such that the support platform 4 is lifted to a position below the surface 3 of the liquid resin 2 such that a liquid layer of the resin having a layer thickness corresponding to the first layer 6a of the object remains between the upper side of the support platform 4 and the surface 3. Subsequently the positioning means 12 controls the illumination apparatus 8 such that the beam 11 strikes the liquid resin layer at points corresponding to the form data generated and treated within the computer 13. By action of the radiation the resin is polymerized or cured in known manner such that the liquid layer is solidified.

After the manufacture of the first layer 6a the displacement means 5 is controlled by the computer such that the support platform 4 is moved down by the thickness of the next layer so that again a layer of liquid resin corresponding to the thickness of the next layer 6b covers the surface of the first layer 6a. The solidification of this layer 6b is made in the same manner as described in connection with the first layer 6a. The object is finished by subsequent lowering of the support platform 4 and solidification of the following layers 6c, 6d.

After manufacture the object 6 is aftertreated. First adherent remainders of liquid resin are removed from the object, for example by blowing and drying or by means of suitable solvents. Thereafter a postcurement by illumination is performed, if required. The following measurement further requires a treatment of the surface to render the same mat or diffusely reflecting, respectively. This can be made by etching, painting, covering with a corresponding diffusely reflecting layer or like known matting processes.

After the aftertreatment the object 6 is measured. To this end the object 6 is positioned, as shown in the right-hand portion of the figure, on a measuring table 29 such that the surface to be measured is within the area of measurement 18 of the measuring appliance 14. The surface is illuminated by the projector 16 and observed through the image recording means 21 and for this purpose the distance of the image recording means 21 from the surface of the object or from the measuring table 29, respectively, is adjusted. Owing to the interference of the projected grating or modulation pattern 20 with the reference grating 26 a Moiré-pattern is generated on the surface which represents contour lines of the object 6. A picture of this line pattern is recorded by the image recording means 21 which feeds a corresponding value on the gray scale for each of the e.g. 512×512 scanning points to the computer 13. The computer uses a known method (e.g. the phase shift method; see document DE-OS 33 28 753) for transforming the distribution of the gray values into corresponding values for the elevation of the object surface at each measuring point, compares this elevation with a rated value and uses this comparison for calculation of a correction value which is stored for use with the production of the following objects.

When subsequently producing like objects 6 a correction is made on the basis of the stored correction data. To this end the computer 13 assigns the measurement correction data to the individual CAD data of the object 6 by using for example a "best fit" analysis. By combining these correction data with the associated CAD data, for example by corresponding consideration of the determined deviation of the shape of the object in viewing direction and perpendicular thereto, the computer 13 determines corrected CAD data and uses the same for the production of the next object. Alternatively or additionally this can be made for example by changing the layer thickness of the individual layer 6a ... 6d by varying the intensity of the light beam 11, e.g. by corresponding variation of the power of the light source 9, or varying the positioning of the beam 11 through the positioning means 12 at those points where the shape of the object 6 has been detected as deviating from the rated value, in such a manner that the shape and contour of the object again equals the rated value at this point. In the same manner a correction of the contour can be made when producing the next object.

In the measuring method the reference grating 26 can be dispensed with in case that for example a CCD chip is used simultaneously as a detector and reference grating, or in case that a phase measurement profilometry or phase measurement triangulation method is used, wherein the reflected line pattern can be directly evaluated by the image recording means 21 by comparison with a reference pattern ("software-Moiré"). Furthermore, any other measuring method allowing the determination of the contour and surface data of the object is suitable for measuring the object. Examples are methods using mechanical feeler probes or other optical methods such as triangulation or optical radar. Dependent on the particular requirements of these methods the aftertreatment for generating the mat or diffusely reflecting, respectively, surface can be dispensed with.

The described method therefore provides the possibility of correcting the manufacture of the object in the manner of a closed control loop and this correction takes not only the primary causes of deformation into account, i.e. the stresses and deformations due to the volume change or shrinkage occurring during the solidification and/or post curing, but also all other inaccuracies such as errors in adjusting the illuminating apparatus, inhomogeneities of the resin, variations in the level adjustment of the support platform etc.

Figure 2:
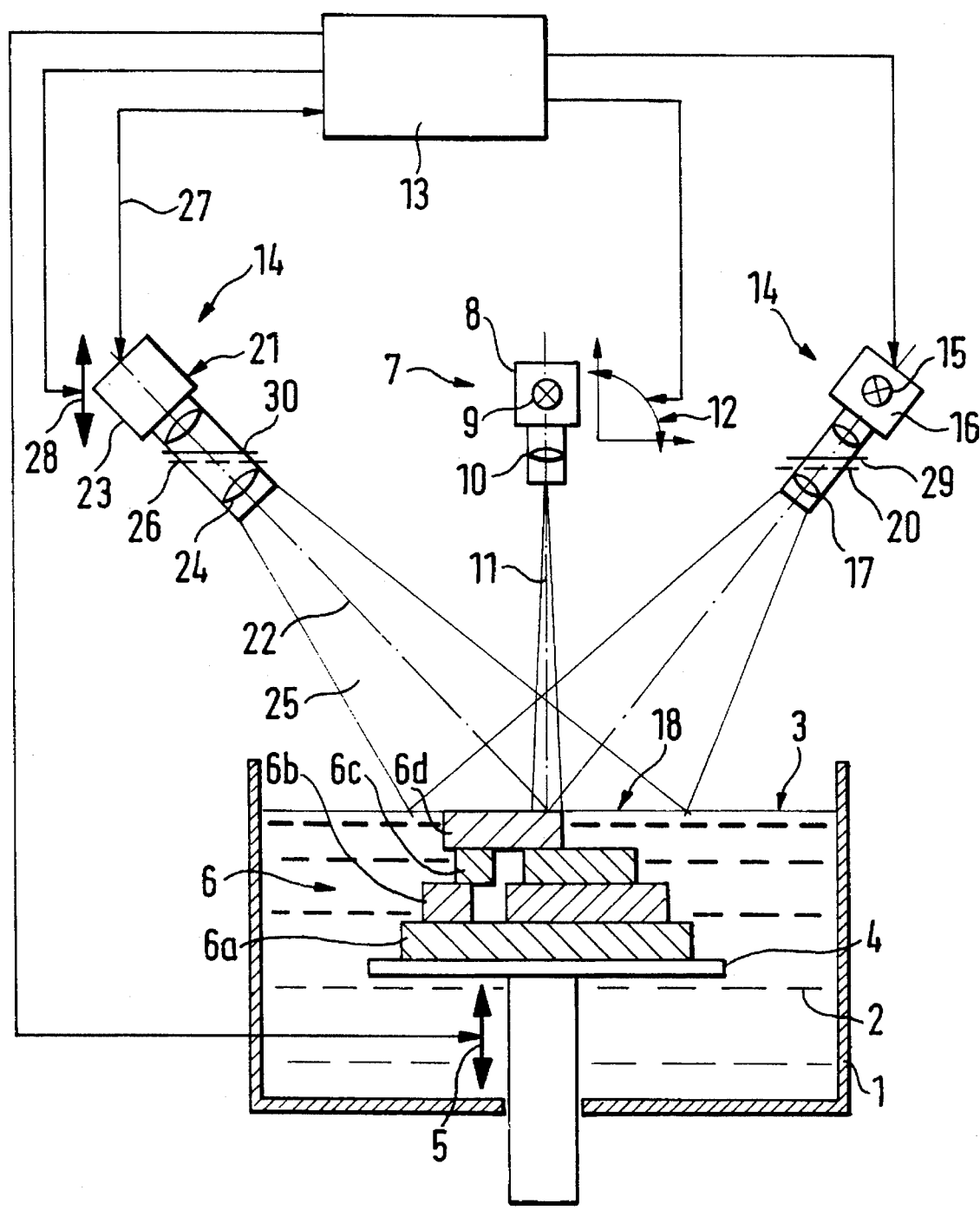
FIG. 2 shows a schematic elevation of a second embodiment of an apparatus according to the invention.

In the apparatus shown in FIG. 2 those parts which correspond to FIG. 1 have the same reference signs attributed thereto. This apparatus differs from the one of FIG. 1 essentially in that the measuring appliance 14 is combined with the solidifying apparatus 7 such that the area of measurement 18 is within the surface 3 in the region of the layers to be solidified of the object 6. In order to avoid a specular reflection at the surface 3 which disturbs the Moiré measurement, if this measurement is performed using fluorescent or phosphorescent radiation. To this end the resin 2 comprises a fluorescent or phosphorescent characteristic or a colouring substance having such a characteristic is admixed to the resin 2, respectively, and the illumination by the light source 15 is carried out with a wave length stimulating the fluorescence or phosphorescence. For example an ultra-violet light source can be used for this purpose or, as shown in FIG. 2, a filter 29 transmitting only or preferably the stimulating wave length, for example ultra-violet radiation, can be arranged in the course of the illuminating radiation. Correspondingly a filter 30 is transmitting only or preferably the fluorescent or phosphorescent radiation of the resin or colouring matter as provided within the course of the viewing beam.

In the apparatus of FIG. 2, after the solidification of a layer and the following lowering of the support platform by an extent corresponding to the thickness of the next layer the surface of the then liquid resin is measured and compared with data stored in the computer 13. This measurement is repeated in short consecutive time periods until the computer determines that the layer thickness of the liquid layer and their unevenness is within a predetermined tolerance range. The solidification of a layer which is made in the same manner as with the apparatus of FIG. 1 is then enabled. It is the advantage of this procedure that the shortest possible waiting time before the solidification can be determined and met. For acceleration of this procedure before or after measuring the surface of the liquid layer the support platform 4 may additionally be lowered below the level of the next layer and the resulting thicker liquid layer can be reduced in thickness to the correct value by means of a (not shown) wiper means which is moved horizontally across the surface 3.

Unlike the embodiment of FIG. 1 the object 6 is not removed from the resin bath 2 for measurement, but the solidified surface and the contour of the layer is measured directly within the bath at the surface 3, preferably after the solidification of a respective layer. This is possible because the stimulated fluorescent or phosphorescent radiation of the resin emits diffuse radiation and the filter 30 stops the specularly reflecting radiation. Hence, there is no time needed for treating the object 6 before measuring. Furthermore, according to the invention an inaccuracy of the surface or of the contour of the layer which has been detected when measuring the layer is directly transmitted to the computer which then corrects the form data of the following layer for correspondingly compensating these deviations such that the object 6 can be corrected itself and such a correction is not limited to following equal objects only.

When measuring the contour of the solidified object the edge separating the solidified region from the liquid resin must be detected with the desired resolution or accuracy, respectively. This is possible in the above-described measuring method because the band width of the fluorescence of the reflected radiation changes and shifts as a function of the phase of the resin. Using a wave length selective receiver it is therefore possible to distinguish between a liquid or solidified resin at a certain point. It is, of course, also possible to briefly lift the object after solidification of each layer above the surface 3 to such an extent that the layer to be measured lies above the surface 3.

In order to obtain the measurement accuracy required for the contour measurement within the entire region of the surface 3 at justifiable effort the measuring appliance 14 can be designed as a movable measuring head which is moved across the surface of the solidified layer 6a ... d in scanning manner and thereby scans the surface zone by zone.

Modifications of the described apparatus and methods are possible. For example, the solidification of the resin can be achieved, dependent on the properties thereof, by means of any other type of electromagnetic radiation, by heat or chemical action. The layer thickness of the liquid resin preceding the solidification can be adjusted not only by lowering the support platform 4, but also by a corresponding varied adjustment or lifting of the level 3 by means of pumps, displacers or the like with stationary support platform, or by applying a defined layer thickness onto the solidified surface for example by spraying. The measurement of the surface coordinates can be made by any other known optical methods such as laser interferometry or laser scanning using phase modulated travel time methods (laser radar). In particular simple optical reflection measurements can be made for determining whether the surface of the liquid resin before the solidification of a layer is even and horizontal. In this case the reflection picture is detected which is obtained for example by illumination under an oblique angle and which changes in case of an uneven or oblique surface.

Furthermore, the measuring table can be mounted on gimbals so as to allow an observation and measurement of the object 6 from all sides thereof. It is further possible with the apparatus of FIG. 1 to integrate the measuring appliance 14 into the manufacture. To this end the measuring appliance 14 is arranged such that it measures the object 6 in a position in which the object is lifted out of the resin bath 2 above the surface 3 by means of the support platform 4. It is not necessary in this case to transport the object from the support platform 4 to the measuring table 29.

The invention is further not restricted to liquid resins. Resin or metal powder may also be used in place of the liquid resin and may be sintered by action of light or laser (laser sintering).

The invention therefore provides a possibility for the exact production of models and workpieces by modelling with the aid of light or laser action. The production of larger quantities of parts is particularly advantageous, because the dimensional correction then needs to be made only initially once or a few times in between.

We claim:

1. A method for the production of a three-dimensional object,
   comprising the steps of
   solidifying superposed layers of the object by forming a layer of initially liquid or powdery material which is solidifiable by action of electromagnetic radiation, solidifying said layer by irradiation corresponding to the shape of the object, measuring the surface or the contour of said layer or object, comparing the measurement result with predetermined data of the object and determining correction data on the basis of said comparison, wherein said surface is measured by projecting a modulation pattern onto said surface to generate a reflected line pattern, viewing said reflected line pattern at an angle with respect to the direction of projection and evaluate said reflected line pattern to determine coordinates of said surface based on said reflected line pattern, and forming the three-dimensional object.

2. The method of claim 1, comprising postcuring said object before measuring.

3. The method of claim 1,
   comprising measuring the surface of said liquid or powdery layer before solidification thereof for determining unevenness of said surface, and enabling said irradiation based on said unevenness measured.

4. The method claim 1,
   comprising combining said correction data with said predetermined data for determining corrected object data for the production of the object.

5. A method for the production of a three-dimensional object, comprising the steps of
   solidifying superposed layers of the object by forming a layer of an initially liquid or powdery material which is solidifiable by action of electromagnetic radiation, solidifying said layer by irradiation corresponding to the shape of the object, measuring the surface or the contour of said layer or object, comparing the measurement result with predetermined data of the object and determining correction data of the basis of said comparison, providing a bath of at least partially fluorescent or phosphorescent material and measuring said layer or object within said bath after the solidification of said layer and forming the three-dimensional object.

6. The method of claim 5, wherein said surface is measured by projecting a first modulation pattern onto said surface, viewing said surface at an angle with respect to the direction of projection through a second modulation pattern, thereby producing an interference pattern, and determining coordinates of said surface based on said interference pattern.

7. The method of claim 6, wherein the projection of the modulation pattern is made using light having a wave length stimulating the fluorescence or phosphorescence and the observation is made within a wave length region of the florescent or phosphorescent radiation of said material.

8. The method of claim 5,
   comprising measuring said surface after solidifying one of said layers and using said determined correction data for the solidification of the layers.

9. The method of claim 5,
   comprising combining said correction data with said predetermined data for determining corrected object data for the production of the objects.

10. Apparatus for producing a three-dimensional object, comprising means for generating superposed layers of a liquid or powdery material which is solidifiable by action of electromagnetic radiation, means for controlled solidification of each said layers in correspondence with the shape of said object, measuring means for measuring said layers or object and for generating measurement data, means for comparing said measurement data with predetermined data of said layers or said object, coupling means for connecting said measuring means and said comparing means with said solidifying means for control thereof in response to the measurement data, means provided in said measuring means for illuminating said object and, image recording means for viewing said object and at angle with respect to the direction of illumination, a first grating disposed in the course of said illumination, optionally a second grating in the course of the viewing beam, and evaluation means coupled to said image recording means.

11. The apparatus of claim 10, comprising a computer coupled to said measuring means and to said solidifying means, said computer generating data sets of said object, comparing said data sets with said measurement data and determining corrected object data on the basis of said comparison, the computer further controlling said solidifying means in response to said corrected object data.

12. The apparatus of claim 10, comprising a light source provided in said solidifying means for generating a focussed light beam, control means for controllably moving the position of said light beam across the surface of said layer, and means for adjusting the intensity of said light beam.

13. The apparatus of claim 10, said illuminating means comprising means for illuminating said object using a radiation which stimulates fluorescence or phosphorescence of said material, said recording means being tuned to said fluorescent or phosphorescent radiation emitted by said material.

14. The apparatus of claim 13, said recording means comprising a wave length selective receiver for determining a shift or variation of the width of said fluorescent of phosphorescent radiation band.

15. Apparatus of producing a three-dimensional object, comprising means for generating superposed layers of a liquid or powdery material which is solidifiable by action of electromagnetic radiation, means for controlled solidification of each of said layers in correspondence with the shape of said object, measuring means for measuring said layers or object and for generating measurement data, means for comparing said measurement data with predetermined data of said layers or said object, coupling means for connecting said measuring means and said comparing means with said solidifying means for control thereof in response to the measurement data, means provided in said measuring means for illuminating said object, image recording means for viewing said object at an angle with respect to the direction of illumination, means for producing a modulation pattern disposed in the course of said illumination, evaluation means coupled to said image recording means, said illuminating means comprising means for illuminating said object using a radiation band which stimulates fluorescence or phosphorescence of said material, said recording means being tuned to said fluorescent of phosphorescent radiation emitted by said material.

16. The apparatus of claim 15, said recording means comprising a wave length selective receiver for determining a shift or variation of the width of said fluorescent of phosphorescent radiation band.

17. The apparatus of claim 15, a computer coupled to said measuring means and to said solidifying means, said computer generating data sets of said object, comparing said data sets with said measurement data and determining corrected object data on the basis of said comparison, the computer further controlling said solidifying means in response to said corrected object data.

18. The apparatus of claim 15, comprising, a light source provided in said solidifying means for generating a focussed light beam control means for controllably moving the position of said light beam across the surface of said layer and means for adjusting the intensity of said light beam.

19. Apparatus for producing a three-dimensional object, comprising means for generating superposed layers of a liquid or powdery material which is solidifiable by action of electromagnetic radiation, means for controlled solidification of each of said layers in correspondence with the shape of said object, measuring means for measuring said layers or object and for generating measurement data, means for comparing said measurement data with predetermined data of said layers or said object, coupling means for connecting said measuring means and said comparing means with said solidifying means for control thereof in response to the measurement data, means provided in said measuring means for illuminating said object, image recording means for viewing said object at an angle with respect to the direction of illumination, means for producing a modulation pattern disposed in the course of said illumination, and evaluation means coupled to said image recording means, said recording means comprising a wave length selective receiver for determining a shift or variation of the width of said fluorescent or phosphorescent radiation band.

20. The apparatus of claim 19, said illuminating means comprising means for illuminating said object using a radiation which stimulates fluorescence or phosphorescence of said material, said recording means being tuned to said fluorescent of phosphorescent radiation emitted by said material.

21. The apparatus of claim 19, comprising a computer coupled to said measuring means and to said solidifying means, said computer generating data sets of said object, comparing said data sets with said measurement data and determining corrected object data on the basis of said comparison, the computer further controlling said solidifying means in response to said corrected object data.

22. The apparatus of claim 19, comprising a light source provided in said solidifying means for generating a focussed light beam, control means for controllably moving the position of said light beam across the surface of said layer, and means for adjusting the intensity of said light beam.

23. The method of claim 1 in which the electromagnetic radiation is light.

24. The method of claim 5 in which the electromagnetic radiation is light.

25. A method for the production of a three-dimensional object, comprising the steps of solidifying superposed layers of the object by forming a layer of initially liquid or powdery material which is solidifiable by action of electromagnetic radiation, solidifying said layer by irradiation corresponding to the shape of the object, measuring the surface and the contour of said layer or object, comparing the measurement result with predetermined data of the object and determining correction data on the basis of said comparison, wherein said surface is measured by projecting a modulation pattern onto said surface to generate a reflected line pattern, viewing said reflected line pattern at angle with respect to the direction of projection and evaluate said reflected line pattern to determine coordinates of said surface based on said reflected line pattern, and forming the three-dimensional object.

26. The method of claim 25, comprising postcuring said object before measuring.

27. The method of claim 25, comprising measuring the surface of said liquid or powdery layer before solidification thereof for determining unevenness of said surface, and enabling said irradiation based on said unevenness measured.

28. The method claim 25, comprising combining said correction data with said predetermined data for determining corrected object data for the production of following objects.

29. The method of claims 25, 26, 27 or 28 in which the electromagnetic radiation is light.

30. A method for the production of a three-dimensional object, comprising the steps of solidifying superposed layers of the object by forming a layer of an initially liquid or powdery material which is solidifiable by action of electromagnetic radiation, solidifying said layer by irradiation corresponding to the shape of the object, measuring the surface and the contour of said layer or object, comparing the measurement result with predetermined data of the object and determining correction data of the basis of said comparison, providing a bath of at least partially fluorescent or phosphorescent material and measuring said layer or object within said bath after the solidification of said layer and forming the three-dimensional object.

31. The method of claim 30, wherein said surface is measured by projecting a first modulation pattern onto said surface, viewing said surface at an angle with respect to the direction of projection through a second modulation pattern, thereby producing an interference pattern, and determining coordinates of said surface based on said interference pattern.

32. The method of claims 31, wherein the projection of the modulation pattern is made using light having a wave length stimulating the fluorescence or phosphorescence and the observation is made within a wave length region of the florescent or phosphorescent radiation of said material.

33. The method of claim 30, comprising measuring said surface after solidifying one of said layers and using said determined correction data for the solidification of the following layers.

34. The method of claim 30, comprising combining said correction data with said predetermined data for determining corrected object data for the production of following objects.

35. The method of claims 31, 32, 33 or 34 in which the electromagnetic radiation is light.

* * * * *